United States Patent [19]
Alien et al.

[11] 3,963,991
[45] June 15, 1976

[54] APPARATUS FOR DISCRIMINATING A PEAK LEVEL OF A VIDEO SIGNAL

[76] Inventors: Imant Karlovich Alien, ulitsa Raunas, 45, kv. 32; Anatoly Vasilievich Nikonenko, ulitsa Lokomativas, 98, kv. 16; Jury Olegovich Popov, ulitsa Veidenbauma, 24, kv. 3; Boris Albertovich Yanson, ultisa B. Altonovas, 8, kv. 1; Arkady Yakovlevich Khesin, ulitsa Suvorova, 16, kv. 18, all of Riga, U.S.S.R.

[22] Filed: July 30, 1974

[21] Appl. No.: 493,664

[52] U.S. Cl. ............................. 328/150; 178/DIG. 3; 307/235 A; 328/179; 328/180; 328/186; 328/187; 328/188
[51] Int. Cl.² ...................... H03K 5/13; H03K 4/02; H04N 5/04
[58] Field of Search ................ 307/235 A; 328/178, 328/179, 180, 186, 187, 188, 150, 103; 178/DIG. 3, 7.1

[56] References Cited
UNITED STATES PATENTS 3,415,950  12/1968  Bartz et al. ........................ 178/7.1
3,868,477  2/1975  Katzman ........................ 178/DIG. 3

OTHER PUBLICATIONS

Olson, "Video Thresholding for Optical Scanners," *IBM Tech. Discl. Bull.*, vol. 14, No. 4, 9/1971; pp. 1127–1128.
Pricer, "Artificial Generation of Grey Scales in Binary-Image Devices," *IBM Tech. Discl. Bull.*, vol. 14, No. 4, 9/1971; p. 1086.

*Primary Examiner*—John S. Heyman
*Assistant Examiner*—L. N. Anagnos
*Attorney, Agent, or Firm*—Holman & Stern

[57] ABSTRACT

An apparatus for discriminating a peak level of a video signal, comprising a series circuit including a switch means, a discriminator with a video signal input, and at least one video signal peak clamping channel. This channel also comprises a series circuit which includes a coincidence circuit, a pulse counter, and a digital-analog converter, the first input of said coincidence circuit being connected to the output of the discriminator, the second input being connected to the output of said switch means, and the third input being connected to a timing pulse generator. The output of the digital-analog converter is connected to the input of said switch means.

6 Claims, 6 Drawing Figures

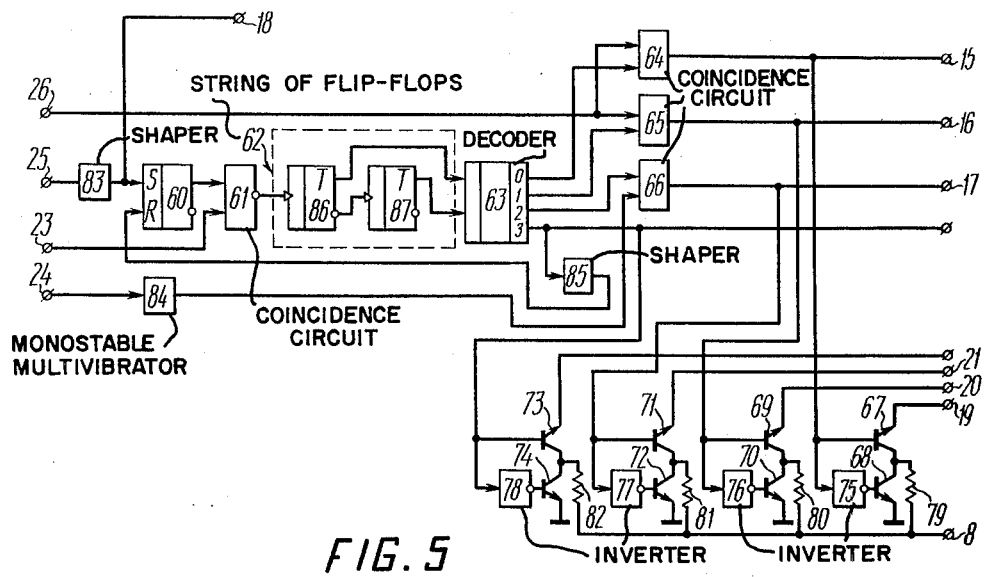

APPARATUS FOR DISCRIMINATING A PEAK LEVEL OF A VIDEO SIGNAL

BACKGROUND OF THE INVENTION

The present invention relates to TV engineering and to devices for measuring video signal levels; more particularly, the invention relates to apparatus for discriminating a peak level of a video signal.

The apparatus of the present invention can most advantageously be used as a reference voltage transducer in video quantizing for measuring geometrical and optical parameters of an image, for example, in medicine, biology, metallography, astronomy and other fields of science and technology in which pattern recognition methods are employed which make use of the information obtained as a result of processing a video signal. The apparatus may also be used for tuning a TV channel with the aid of reference images.

DESCRIPTION OF THE PRIOR ART

A video quantizing system is known (cf. U.S. Pat. No. 3,415,950; Cl. 178-7.1), which comprises a voltage discriminator having a video signal input, a grey signal clamping circuit, a black-white peak detector, a white signal clamping circuit including a tapped delay line and an integrating amplifier, and a switch means for determining the sequence of operation of the above units, all said units of the video quantizing system being electrically interconnected.

A video signal is applied to the voltage discriminator and, at the same time, to the input of the black-white peak detector, as well as to the input of the "white" signal clamping circuit. Depending on the information contained in the video signal, connected to the second input of the discriminator is the output of one of the above-mentioned signal clamping circuits, which clips the video signal.

Although this video quantizing system is capable of discriminating a peak level of a video signal, video quantizing thereby can only be effected at one discrimination level; further it fails to separately discriminate the levels of the white and black levels in the video signal. Hence, it is impossible to quantize a video signal at any level between the peak white and black levels.

Another disadvantage inherent in the prior art system is the low accuracy of clamping the video signal discrimination level.

The prior art system suffers from yet another disadvantage which lies in that history stored in the long-time store circuit has to be introduced into the information on the average level of a video signal, which history is indicative of how the video signal was used prior to clamping.

SUMMARY OF THE INVENTION

It is a primary object of the present invention to provide, in an apparatus for discriminating the peak levels of a video signal, circuitry built around digital devices, which would ensure the clamping of a peak level of a video signal over the entire image field (or over a given raster area).

The foregoing and other objects are attained in an apparatus for discriminating a peak level of a video signal, comprising a series circuit including a switch means, a discriminator with a video signal input, and at least one video signal peak clamping channel. The video signal peak clamping channel is, according to the invention, in the form of a series circuit including a coincidence circuit, a pulse counter and a digital-analog converter, one input of the coincidence circuit being connected to the output of the discriminator, a second input thereof being connected to the output of the switch means, a third input being connected to a timing pulse generator, and the output of the digital-analog converter being connected to the input of the switch means.

The video signal peak clamping channel should preferably be connected to the discriminator via an inverter.

The reference voltage input of the digital-analog converter of each subsequent video signal peak clamping channel should advisably be connected to the output of the digital-analog converter of one of the video signal peak clamping channels.

It is also advisable that the reference voltage input of the digital-analog converter of each subsequent video signal peak clamping channel be connected to the output of the digital-analog converter of the preceding video signal peak clamping channel.

BRIEF DESCRIPTION OF THE DRAWINGS

The invention will now be described in greater detail with reference to a specific embodiment thereof, taken in conjunction with the accompanying drawings, wherein:

FIG. 5 is a circuit diagram of an embodiment of the switch means of the apparatus for discriminating a peak level of a video signal, according to the invention; and FIGS. 6 ($a, b, c, d, e, f, g$) are time charts illustrating the operation of the apparatus for discriminating a peak level of a video signal, according to the invention.

DETAILED DESCRIPTION OF THE PREFERRED EMBODIMENTS

Figure 1:
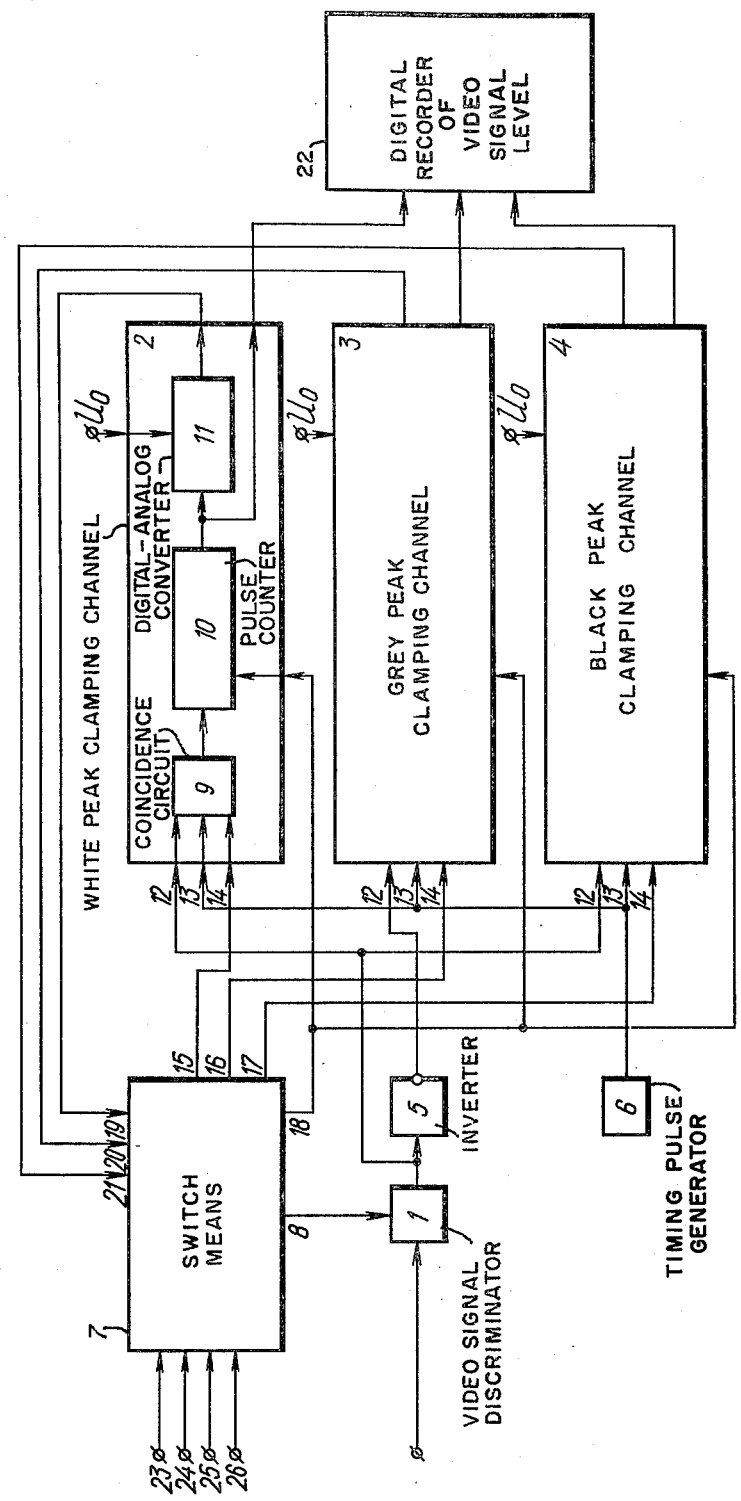
FIG. 1 is a block diagram of an apparatus for discriminating a peak level of a video signal, according to the invention.

Referring now to FIG. 1, the apparatus for discriminating a peak level of a video signal is seen to comprise a discriminator 1 with a video signal input and at least one video signal peak clamping channel 2. The number of clamping channels depends on the number of the objects being analyzed and, in the general case, with $n$ objects, is equal to "$2n + 1$", i.e. one black peak clamping channel is used for the entire field of view, while for each object there is a white peak and a grey peak clamping channel. In the embodiment under consideration, there are three video signal peak clamping channels 2, 3 and 4: the white peak clamping channel 2, the grey peak clamping channel 3, and the black peak clamping channel 4. One of these channels, namely the grey peak clamping channel 3, is connected to the output of the discriminator 1 via an inverter 5, while the white peak clamping channel 2 and the black peak clamping channel 4 are connected to the output of the discriminator 1 directly. The channels 2 and 4 may also be connected to the output of the discriminator 1 via the inverter 5 (this and other embodiments are not shown). The apparatus of the present invention also comprises a timing pulse generator 6 connected to the input of each channel, and a switch means 7 whose output 8 is connected to another input of the discriminator 1 as well as to the input and output of each channel 2, 3 and 4.

The video signal peak clamping channel 2 is arranged as a series circuit including the following components: a coincidence circuit 9, a pulse counter 10 and a digital-analog converter 11. Each coincidence circuit 9 has three inputs 12, 13 and 14, one input 14 being connected to a respective output 15, 16 or 17 of the switch means 7, the second input 12 being connected to the output of the discriminator 1 (or to the output of the inverter 5), and the third input 13 being connected to the output of the timing pulse generator 6. Each pulse counter 10 has one of its two inputs connected to the output of said coincidence circuit 9 and the other input connected to an output 18 of the switch means 7. Each digital-analog converter 11 also has two inputs, one being connected to the output of the pulse counter 10 and the other receiving a reference voltage $U_o$. The output of each digital-analog converter 11 is connected to a respective input 19, 20 or 21 of the switch means 7, while the output of the pulse counter 10 is additionally connected to a digital recorder 22 of a video signal level. The channels 3 and 4 are arranged similarly to the channel 2, however they are not shown in the drawings for the sake of simplicity.

The switch means 7 has three inputs 23, 24 and 25. Applied to the input 23 are frame synchronizing pulses, the input 24 receives line synchronizing pulses, and the input 25 is the trigger input. In the embodiment disclosed herein, the switch means 7 has an additional input 26 applied whereto is a masking signal.

The digital recorder 22 of a video signal level may comprise, for example, illuminated indicator boards, neon-digital displays, digital printers, punching units, direct data input units of digital computers, and the like.

Figure 2:
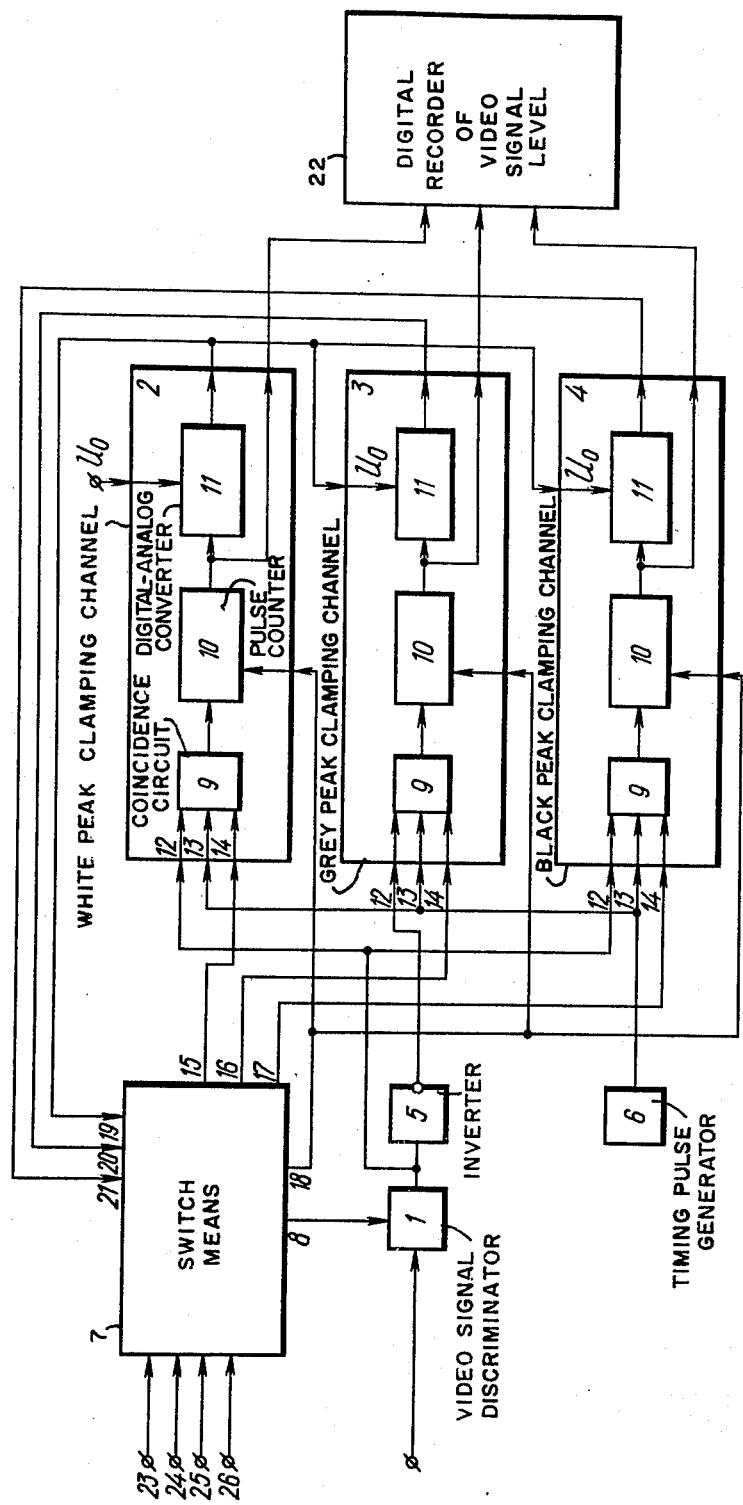
FIGS. 2 and 3 are block diagrams which illustrate two different ways of connecting the reference voltage input of the digital-analog converter of each video signal peak clamping channel, according to the invention.

The $U_o$ reference voltage input of the digital-analog converter 11 (FIG. 2) of each subsequent video signal peak clamping channel is connected to the output of the digital-analog converter 11 of one of the channels, whereby the accuracy of the apparatus is substantially enhanced. This channel may comprise the white peak clamping channel 2.

Figure 3:
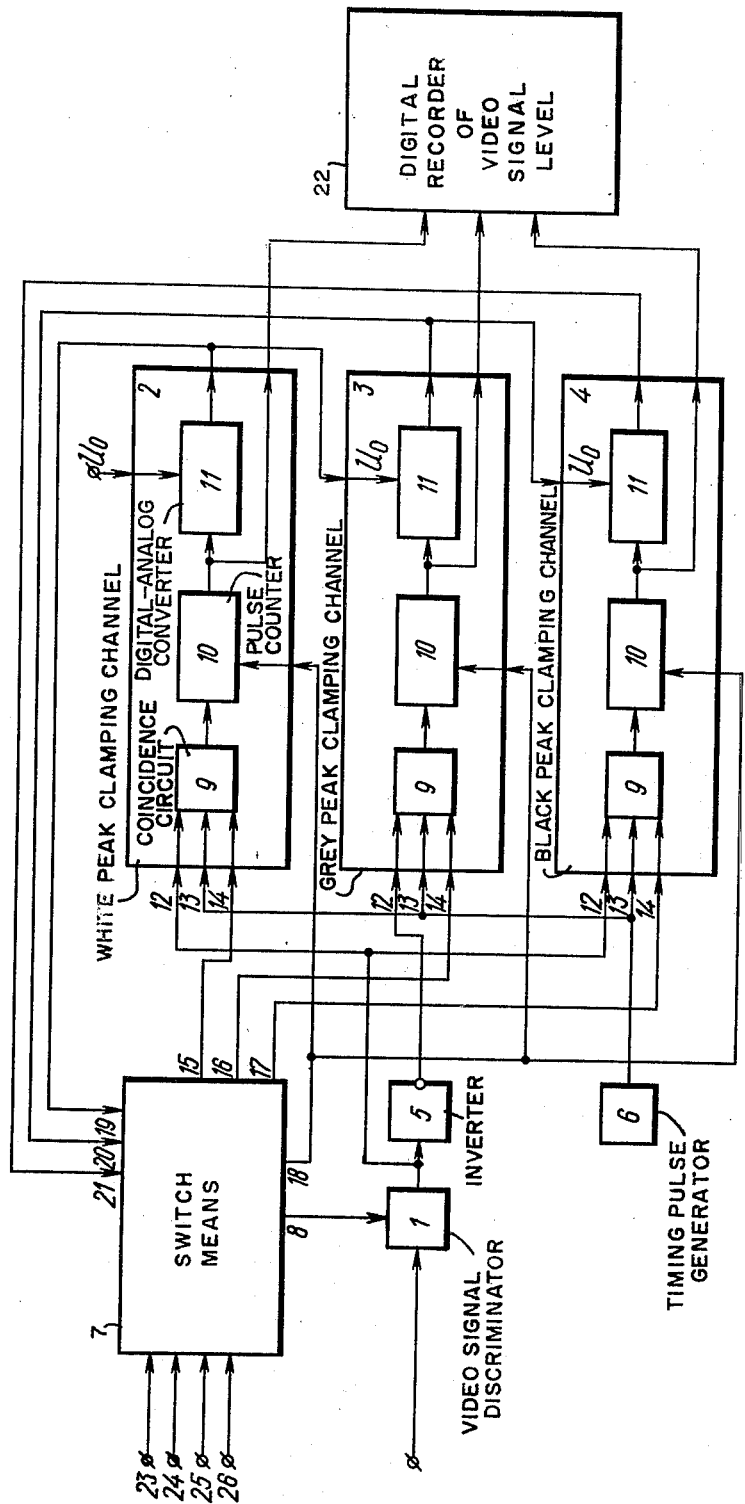

In addition, the $U_o$ reference voltage input of the digital-analog converter 11 (FIG. 3) of each subsequent video signal peak clamping channel can be connected to the output of the digital-analog converter 11 of the preceding channel.

In both cases, the input of the digital-analog converter 11 of one clamping channel is permanently connected to the source of the reference voltage $U_o$ (not shown).

As has been mentioned above, a video signal peak clamping channel (FIG. 4) comprises a series circuit including the coincidence circuit 9, the pulse counter 10 and the digital analog converter 11.

Figure 4:
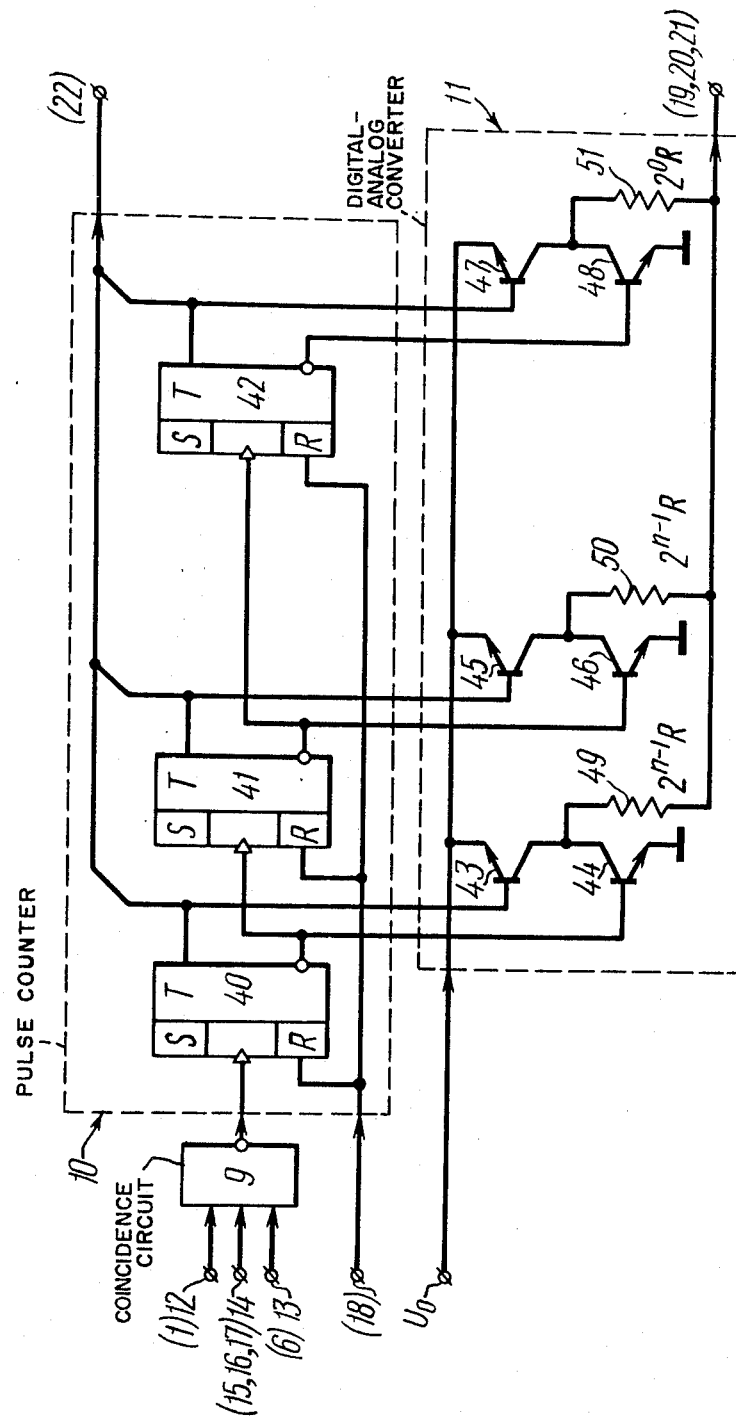
FIG. 4 is a circuit diagram of an embodiment of a video signal peak clamping channel, according to the invention.

In the embodiment under consideration as shown in FIG. 4, the pulse counter 10 comprises flip-flops 40, 41, 42, etc. The number $n$ of flip-flops in the pulse counter 10 is determined by the required accuracy of clamping a video signal level and by the resolution (sensitivity) of the discriminator 1. It can be determined from either the following expression:

$$n = \frac{U_o}{2\delta U} \qquad (1)$$

wherein $n$ is the number of flip-flops,
$U_o$ is the reference voltage,
$\delta U$ is the reading error,
on the one hand, on from the expression $$n = \frac{U_o}{U_{min}} \qquad (2)$$

wherein $n$ is the number of flip-flops,
$U_o$ is the reference voltage,
$U_{min}$ is the sensitivity of the discriminator, on the other.

The digital-analog converter 11 comprises a set of switches each including a pair of transistors 43-44; 45-46; 47-48; etc. The bases of these transistors are connected to the outputs of respective flip-flops 40, 41, 42... of the pulse counter 10, and the emitters of the transistors 43, 45, 47 ... are connected to the $U_o$ reference voltage input. Connected to the common point of each pair of transistors is a balance resistor 49, 50, 51..., whose resistance $2^{k-1} R$ is selected according to the number $k$ of the digit of the pulse counter 10, controlling this particular switch. The other ends of the balance resistors 49, 50, 51... are interconnected and coupled to the input 19, 20 or 21 of the switch means 7. The input 12 of the coincidence circuit 12 is connected to the output of the discriminator 1, the input 13 is connected to the output of the timing pulse generator 6, and the input 14 is connected to the output 15, 16 or 17 of the switch means 7.

The outputs of the flip-flops 40, 41, 42 ... of the pulse counter 10 are connected to the input of the digital recorder 22 of the video signal level, and one of the inputs of each flip-flop is connected to the output 18 of the switch means 7.

The switch means 7 (FIG. 1) of the proposed apparatus for discriminating a peak level of a video signal comprises, in the embodiment shown in FIG. 5 (which utilizes, for example integrated circuits of the TTL (transistor-transistor logic) structure) a series circuit including an RS flip-flop 60, a coincidence circuit 61, a string 62 of flip-flops, and a decoder 63 having four outputs 0, 1, 2 and 3. Further, the switch means 7 includes three coincidence circuits 64, 65, 66 and a set of switches each built around a pair of transistors 67, 68; 69, 70; 71, 72; and 73, 74. In addition, the switch means 7 comprises inverters 75, 76, 77 and 78 each being connected in the base circuit of a respective transistor 68, 70, 72 and 74 of each switch. Th common points of each pair of transistors 67, 68; 69, 70; 71, 72 and 73, 74 are connected to the first ends of load resistors 79, 80, 81 and 82, respectively, the second ends of which are connected to the output 8 of this switch means. The switch means also includes a shaper 83 of the leading edge of the trigger pulse, the input of which is the input 25 of the switch means, the output being connected to the S input of the RS flip-flop 60 as well as to the output 18 of the switch means; a monostable multivibrator 84 whose input is the input 24 of the switch means and whose output is coupled to one of the inputs of the coincidence circuit 66, the other input of which is connected to the output "2" of the decoder 63; and a shaper 85 of leading edges of pulses, the input of which is connected to the output "3" of the decoder 63 and the output of which is connected to the R input of the RS flip-flop 60.

The additional input 26 of the switch means 7 is, in fact, the combined input of two coincidence circuits 64 and 65, which coincidence circuits have other inputs connected to the outputs "0" and "1", respectively, of the decoder 63.

The string 62 is made up of two series-connected flip-flops 86 and 87, the free outputs of which are coupled to respective inputs of the decoder 63. The input of the flip-flop 86 is connected to the output of the coincidence circuit 61. The emitters of the transistors 67, 69 and 71 are connected to the inputs 19, 20 and 21, respectively, of the switch means 7, which, in turn, are connected to respective inputs of the digital-analog converters 11 of respective video signal peak clamping channels. The bases of the transistors 67, 69 and 71 are connected to the outputs of the coincidence circuits 64, 65 and 66, respectively, and to the inputs of the inverters 75, 76 and 77, respectively.

The base of the transistor 73 is connected to the input of the inverter 78 and to the output "3" of the decoder 63. In case the apparatus for discriminating a peak level of a video signal is used in conjunction with other measuring instruments, the output "3" of the decoder 63 may serve as an independent output of the entire switch means.

The outputs of the coincidence circuits 64, 65 and 66 are, at the same time, the outputs 15, 16 and 17, respectively, of the switch means 7. In this case, the emitter of the transistor 73 should be coupled to the output of the measuring instrument in conjunction with which the apparatus of the present invention may be used.

The hereinabove disclosed apparatus for discriminating a peak level of a video signal operates as follows.

As soon as a trigger pulse is applied to the input 25 (FIG. 1) of the switch means 7, a signal appears at the output 18 thereof setting each pulse counter 10 of the video signal peak clamping channels 2, 3 and 4 to the initial position, the pulse counters 10 of the white peak and black peak clamping channels 2 and 4, respectively, being set to a position whereat applied from the output of the digital-analog converters 11 to the inputs 19 and 21 of the switch means 7 is a potential satisfying the condition:

$$|U_1| < |U_2| \ldots, \quad (3)$$

wherein $U_1$ is the potential across the output of the digital-analog converter 11 of the white peak and black peak clamping channels 2 and 4, respectively; and $U_2$ is the potential of the black level in the video signal.

The pulse counter 10 of the grey peak clamping channel 3 is set to a position whereat applied from the output of the digital-analog converter 11 to the input 20 of the switch means 7 is a potential satisfying the condition:

$$|U_3| > |U_4| \ldots, \quad (4)$$

wherein $U_3$ is the potential across the output of the digitalanalog converter 11 of the grey peak clamping channel 3; and $U_4$ is the peak value of the potential of the white level in the video signal.

At the outputs 15, 16 and 17 of the switch means 7 there appear, in succession, enabling signals which are applied to the inputs 14 of the coincidence circuits 9 of the clamping channels 2, 3 and 4 to enable the white peak clamping channel 2 to operate within the first video signal field, the channel 3 to operate within the second video signal field, and the channel 4 to operate within the third video signal field. At the same time, the switch means 7 alternately connects the outputs of the digital-analog converters 11 of the video signal peak clamping channels 2, 3 and 4 to the input of the discriminator 1.

Consider now the operation of the white peak clamping channel 2. An enabling signal is applied to the input 12 of the coincidence circuit 9 from the output of the discriminator 1. If the level of the video signal (FIG. 6a) is, in absolute terms, higher than that of the signal applied from the output of the digital-analog converter 11 (FIG. 6b), pulses from the timing pulse generator 6 (FIG. 6c) appear at the output of the coincidence circuit 9. Acted upon by a signal (FIG. 6c) from the output of the coincidence circuit 9, the pulse counter 10 changes its state with the result that the potential (FIG. 6b) across the output of the digital-analog converter 11 is changed, too. If the potential across the output of the digital-analog converter 11 of the white peak and black peak clamping channels 2 and 4 is lower than the potential of the black level, the potential across the output of the discriminator 1 remains unchanged and the above-described cycle will repeat itself until the potential (FIG. 6b) across the output of the digital-analog converter 11 exceeds the video signal level.

If at the moment of appearance of the enabling signal at the input 14 of the coincidence circuit 9 there arises a situation where the potential across the output of the digital-analog converter 11 of the white peak and black peak clamping channels 2 and 4, respectively, is lower than the potential of the black level, a further increase, in absolute terms, takes place in the potential (FIG. 6b) across the output of the digital-analog converter 11. This process will repeat itself until the white peak, the number whereof is sent from the pulse counter 10 to the digital recorder 22 of a video signal device, is clamped within one half-frame of the TV raster.

The black peak clamping channel 4 operates in a similar manner with the difference that the enabling signal from the output 17 of the switch means 7 is applied to the input 14 of the coincidence circuit 9 of the clamping channel 4 only for a period of time required for the passage of a line blanking pulse, permitting thereby to clamp the black peak in the video signal (FIG. 6d, e).

The grey peak clamping channel 3 operates in a manner like the white peak clamping channel 2 with the difference that the signal from the output of the discriminator 1 is applied to the input 12 of the coincidence circuit 9 via the inverter 5. This causes an enabling signal to appear at the input 12 of the coincidence circuit 9, provided condition 4 is satisfied. In other words, if the potential across the output of the digital-analog converter 11 of the grey peak clamping channel 3 is higher, in absolute terms, than the video signal level, pulses (FIG. 6f) from the timing pulse generator 6 appear at the output of the coincidence circuit 9 of the black peak clamping channel 4. The signal at the output of the digital-analog converter 11 of the grey peak clamping channel 3 is illustrated in FIG. 6g.

Thus, following three fields of the TV raster, the apparatus for discriminating a peak level of a video signal in the embodiment considered herein effects clamping of three video signal peaks, namely, white, grey and black peaks, the information on the levels being obtained, in digital form, from the outputs of the pulse counters 10 of respective clamping channels 2, 3 and 4 and sent to the input of the digital recorder 22 of a video signal level. Further, the video signal levels, stored in analog form, may be derived from the outputs of the digital-analog converters 11 of the clamping channels 2, 3 and 4 and transmitted to a peripheral device effecting video quantizing at any clipping level between the peak levels, and it makes absolutely no difference whether said clipping level is selected discretely or continuously, automatically or manually. If the $U_o$ reference voltage input of each digital-analog converter 11 (FIG. 2) of the clamping channels 3 and 4 is connected to the output of the digital-analog converter 11 of the channel 2, the reference voltage inputs of the digital-analog converters 11 of the channels 3 and 4 will receive a signal from the output of the digital-analog converter 11 of the white peak clamping channel 2. This enables the accuracy of clamping the grey and black peaks to be enhanced without increasing the digit capacity of the pulse counter 10. Otherwise, the apparatus shown in FIG. 2 operates in a manner like the one described above.

A further improvement in the accuracy of clamping the black peak level without increasing the digit capacity of the pulse counter 10 is achieved by connecting the $U_o$ reference voltage input of the digital-analog converter 11 (FIG. 3) of each subsequent clamping channel to the output of that of the preceding channel. In this case, applied to the $U_o$ reference voltage input of the digital-analog converter 11 of the black peak clamping channel 4 is a signal from the output of the digital-analog converter of the grey peak clamping channel 3 (FIG. 6g). The rest of the apparatus operates in the above-described manner.

Turning now to the circuit diagram of FIG. 4, the video signal peak clamping channel operates in the following manner.

Applied from the output 18 of the switch means 7 to all the R inputs of the flip-flops 40, 41 and 42 at the same time are pulses which set the pulse counter 10 to the initial position. As a result, an initial potential appears across the output of the digital-analog converter 11, satisfying the condition 3 (FIG. 6b, e) or 4 (FIG. 6g) depending on the video signal peak level clamped by the channel 2, 3 or 4. If enabling pulses are applied to the inputs 12 and 13 of the coincidence circuit 9, pulses from the timing pulse generator 6, applied to the input 13 of the coincidence circuit 9, appear at the output of the latter (FIG. 6c, d, f). From the output of the coincidence circuit 9, these pulses are applied to the flip-flops 40, 41 and 42 with the result that these flip-flops have their states changed and, with the aid of the switches built around the transistors 43, 44, 45, 46, 47, 48, connect the ends of the ballast resistors 49, 50 and 51 to the source of the reference voltage or to the zero potential. As a result, across the output of the digital analog converter 11 connected to the inputs 19, 20 and 21 of the switch means 7, there appears a voltage (FIG. 6b, e.g.) varying stepwise until the enabling signal at one of the inputs 12 or 14 of the coincidence circuit 9 ceases.

The sequence of operation of the video signal peak clamping channels 2, 3 and 4 and that connection of the output of the digital-analog converter 11 of a respective clamping channel 2, 3 or 4 to the input of the discriminator 1 are controlled by the switch means 7. More particularly, the sequence of operation of the video signal peak clamping channels 2, 3 and 4 is ensured by the switch means 7 sending control pulses from its outputs 15, 16 and 17 to the inputs 14 of the coincidence circuits 9.

At the same time, these signals control the operation of the switches built around the transistors 67, 68, 69, 70, 71 and 72, which switches connect the output of a respective digital-analog converter 11 to the input of the discriminator 1 via the output 8 of the switch means 7.

The control pulses at the outputs 15, 16 and 17 of the switch means 7 are shaped as follows.

As soon as a trigger pulse (potential differential) is applied to the input 25, the shaper 83 shapes a pulse applied via the output 18 of the switch means 7 to the input of the pulse counter 10, which pulse changes, at the same time, the state of the RS flip-flop 60. Therewith, an enabling signal appears at the input of the coincidence circuit 61 connected to the output of the RS flip-flop 60, and frame synchronizing pulses are applied from the input 23 of the switch means 7 to the output of the coincidence circuit 61 connected to the input of the slide rule 62. When acted upon by these pulses, the flip-flops 86 and 87 of the string 62 change their state, and pulses appear at each output of the decoder 63 in succession, a pulse per output, corresponding to the scan period of the first (at the output "0"), second (at the output "1") and third (at the output "2") TV picture frames.

These pulses are applied to respective inputs of the coincidence circuits 64, 65 and 66. Other inputs of the circuits 64 and 65 may receive a masking signal from a peripheral device, for the selection of a raster area to be analyzed. The other input of the coincidence circuit 66 receives a pulse from the output of the monostable multivibrator 84 which is triggered by the trailing edges of the line synchronizing pulses from the input 24 of the switch-means 7. The duration of the pulse from the monostable multivibrator 84 is equal to that of the video signal blanking pulse. Thus, the signal applied from the output of the coincidence circuit 66 to the output 17 of the switch means 7 controls the operation of the black peak clamping channel 4 and that of the switch built around the transistors 71 and 72. The pulses applied from the outputs of the coincidence circuits 64 and 65 to the terminals 15 and 16 control the operation of the white peak and grey peak clamping channels 2 and 3 and the switches comprised of the transistors 67, 68 and 69, 70, respectively.

With the arrival of the fourth frame synchronizing pulse, a potential appears across the output "3" of the decoder 63, which may be used to actuate an external measuring instrument and operate the switch comprised of the transistors 73 and 74.

In addition, the shaper 85 shapes a pulse from the potential drop across the output "3" of the decoder 63, which pulse is then applied to the R input of the RS flip-flop 60, as a result of which the RS flip-flop 60 is brought to the initial state, the coincidence circuit 61 is blocked, and the operation of the switch means 7 discontinues until the arrival of the next trigger pulse at the input 25.

What is claimed is:

1. An apparatus for discriminating a peak level of a video signal, comprising: a video signal discriminator with two inputs, a first being the video signal input, and an output; a switch means with four switch inputs and three switch outputs, the first switch input receiving frame synchronizing pulses, the second switch input receiving line synchronizing pulses, the third switch input being the input through which the apparatus is triggered, and the first of said switch outputs connected to the second input of said discriminator; a timing pulse generator; a plurality of video signal peak clamping channels each of which includes: a coincidence circuit with three inputs and an output, the first input of said coincidence circuit connected to the output of said discriminator, the second input thereof connected to the second switch output of said switch means, and the third input connected to said timing pulse generator; a pulse counter having two inputs, one connected to the output of said coincidence circuit and the other connected to the third switch output of said switch means, and an output; a digital-analog converter having two d/a inputs and a d/a output, one of said d/a inputs receiving a reference voltage and the other connected to the output of said pulse counter, the d/a output connected to the fourth switch input of said switch means.

2. An apparatus as claimed in claim 1, further comprising an inverter through which at least one of said video signal peak clamping channels is connected to said video signal discriminator.

3. An apparatus as claimed in claim 1, wherein said reference voltage input of said digital-analog converter of all but one of said video signal peak clamping channels is connected to the output of the digital-analog converter of said one of said video signal peak clamping channels.

4. An apparatus as claimed in claim 1, wherein said reference voltage input of said digital-analog converter of all but one of said video signal peak clamping channels is connected to the output of the digital-analog converter of a preceding video signal peak clamping channel.

5. A video signal peak clamping channel in an apparatus for discriminating a peak level of a video signal of claim 1, comprising: a coincidence circuit with three inputs and an output, the first input being connected to the output of said video signal discriminator, the second input being connected to the second output of said switch means, and the third input being connected to said timing pulse generator; a pulse counter including a plurality of series-connected flip-flops each having a pair of outputs, the number of which is determined by the required accuracy of clamping a video signal peak level and by the resolution of said video signal discriminator; a digitalanalog converter including a plurality of switches each being made up of a pair of transistors, the bases of said transistors being connected to the outputs of said flip-flops, and the emitters of said transistors being connected to the reference voltage input; resistors equal in number to said switches, one end of each said resistor being connected to the collectors of a respective pair of transistors, while the other ends of all said resistors are interconnected to form an output of said digital-analog converter which is coupled to said fourth input of said switch means.

6. A switch means in an apparatus for discriminating a peak level of a video signal of claim 1, comprising: a shaper of the leading edge of the trigger pulse; an RS flip-flop with two inputs, R and S, and an output, the S input being connected to the output of said shaper; a coincidence circuit with two inputs and an output, one of said inputs receiving frame synchronizing pulses, while the other input is connected to the output of said flip-flop; a string of two series-connected flip-flops, the input of the first flip-flop being connected to the output of said coincidence circuit; a decoder with two inputs, each input being connected to a respective free output of the first and second flip-flop, and four outputs; three coincidence circuits, one of the inputs of each coincidence circuit being connected to a respective output of said decoder, the other inputs of the first two coincidence circuit being combined into one to form an additional input of said switch means; a monostable multivibrator whose input receives line synchronizing pulses and whose output is connected to the free input of said third coincidence circuit; an additional shaper of the leading edges of pulses, the input of which is connected to the fourth output of said decoder, and the output is connected to the R input of said RS flip-flop; a plurality of switches, each comprised of a pair of transistors, the collectors of each pair of transistors being connected via a respective resistor to the first output of said switch means; inverters equal in number to said pairs of transistors, each being connected in the base circuit of a respective said transistor and to the base of the other transistor, while the common point of said inverter and of the base of the other transistor is connected to the output of a respective coincidence circuit.

* * * * *